(12) United States Patent
Berkmann et al.

(10) Patent No.: US 7,657,819 B2
(45) Date of Patent: Feb. 2, 2010

(54) METHOD AND APPARATUS FOR TERMINATION OF ITERATIVE TURBO DECODING

(75) Inventors: Jens Berkmann, Munich (DE); Bhawana Shakya, Kathmandu (NP)

(73) Assignee: Infineon Technologies AG (DE)

( * ) Notice: Subject to any disclaimer, the term of this patent is extended or adjusted under 35 U.S.C. 154(b) by 485 days.

(21) Appl. No.: 11/366,982

(22) Filed: Mar. 2, 2006

(65) Prior Publication Data

US 2007/0067703 A1      Mar. 22, 2007

(30) Foreign Application Priority Data

Mar. 4, 2005     (DE) ................ 10 2005 010 006

(51) Int. Cl.
*H03M 13/00*     (2006.01)
(52) U.S. Cl. ................ 714/755; 714/794; 714/795; 714/796; 714/799; 375/262; 375/341
(58) Field of Classification Search ........... 714/752, 714/755, 758, 794–796; 375/262, 341
See application file for complete search history.

(56) References Cited

U.S. PATENT DOCUMENTS 6,161,209 A * 12/2000 Moher ............... 714/780
6,738,948 B2 * 5/2004 Buckley et al. ........ 714/794
7,249,304 B2 * 7/2007 Yu et al. ............. 714/755
7,370,332 B2 * 5/2008 Kutz et al. ........... 714/780

OTHER PUBLICATIONS

Two Simple Stopping Criteria for Turbo Decoding; Shao, R.Y. et al.; IEEE Transactions on Communications; vol. 47, No. 8, pp. 1117-1120, Aug. 1999.
Generalized Stopping Criterion for Iterative Decoders; Taffin. A.; Electronics Letters; vol. 39; No. 13; pp. 993-994, Jun. 26, 2003.
A Simple Stopping Criterion for Turbo Decoding; Wu, Y. et al.; IEEE Communications Letters; vol. 4, No. 8; pp. 258-260, Aug. 2000.
Reducing Average Number of Turbo Decoding Iterations; Shibutani, A. et al.; Electronics Letters; vol. 35; No. 9; pp. 701-702, Apr. 29, 1999.
Low Complexity Stopping Criteria for UMTS Turbo-Decoders; Gilbert, F. et al.; Vehicular Technology Conference; vol. 4; pp. 2376-2380, Apr. 2003.
Decoding Metrics and Their Applications in VLSI Turbo Decoders; Wang, Z. et al.; Proc. 2000 Conference on Acoustics, Speech and Signal Processing (ICASSP'00); pp. 3370-3373, Sep. 2000.

(Continued)

*Primary Examiner*—Esaw T Abraham
(74) *Attorney, Agent, or Firm*—Dickstein, Shapiro, LLP.

(57) ABSTRACT

In the method for termination of turbo decoding, a plurality of first LLR values ($L_a^i(k)$) of a-priori information and a plurality of second LLR values ($L_e^i(k)$) of extrinsic information are called up. A value is determined for a decision variable which is characteristic of the number of mathematical sign discrepancies between the first $L_a^i(k)$) and the second $L_e^i(k)$) values. The turbo decoding is terminated if the number of mathematical sign discrepancies is less than or at least equal to a first number or if the number is greater than or at least equal to a second number.

19 Claims, 6 Drawing Sheets

OTHER PUBLICATIONS

Stopping Rules for Turbo Decoders; Matache, A. et al.; TMO Progress Report 42-142; http://tda.jpl.nasa.gov/progress_report; pp. 1-22, Aug. 15, 2000.

Near Shannon Limit Error—Correcting Coding and Decoding: Turbo-Codes (1); Berrou, A. et al.; Proc. 1993 International Conference of Communications (ICC '93); Geneva, Switzerland; pp. 1064-1070, May 1993.

Iterative Decoding of Binary Block and Convolutional Codes; Hagenauer, J. et al.; IEEE Transactions on Information Theory; vol. 42; No. 2; pp. 429-445, Mar. 1996.

* cited by examiner

METHOD AND APPARATUS FOR TERMINATION OF ITERATIVE TURBO DECODING

PRIORITY

This application claims priority from German Patent Application No. DE 10 2005 010 006.6, which was filed on Mar. 4, 2005, and is incorporated herein by reference in its entirety.

TECHNICAL FIELD

The invention relates to a method and a corresponding apparatus for termination of turbo decoding, with the turbo decoding of the data being carried out iteratively.

BACKGROUND

Turbo coding represents a particularly powerful channel-coding method for the transmission of digital data via a mobile radio transmission channel. So-called turbo codes are used for turbo coding. Turbo codes are binary recursive convolution codes, which are linked in parallel. Turbo coding is used in particular for third-generation mobile radio systems based on UMTS-3GPP Standard (UMTS: Universal Mobile Telecommunication System; 3GPP: 3rd Generation Partnership Project.

FIG. 1 illustrates a turbo coder based on the UMTS-3GPP Standard, which comprises two recursive systematic convolution coders 1 and 2, which are also referred to as RSC coders (RSC—recursive systematic convolutional). In this case, the systematic output of the second RSC coder 2 which loops through the input signal of the RSC coder 2 is not used, and is therefore not shown. The first RSC coder 1 receives the input bit sequence $x_s(k)$ directly, while an interleaver 3 is connected upstream on the input side of the second RSC coder 2 and carries out block-by-block interleaving of the input bit sequence $x_s(k)$. Each RSC coder 1 and 2 uses a shift register with feedback to generate redundant information items $x_{p1}(k)$ and $x_{p2}(k)$, respectively. The resultant coded data sequence is produced by linking two code components, with the first code component comprising the systematic information $x_s(k)$ and the redundant information $x_{p1}(k)$ of the first RSC coder 1, and the second code component comprises the redundant information $x_{p2}(k)$ of the second RSC coder 2. The code components are linked by means of a multiplexer (not illustrated) which assembles the individual bit streams $x_s(k)$, $x_{p1}(k)$ and $x_{p2}(k)$ in a suitable manner to form a resultant data sequence. A puncturer (which is not illustrated) which masks out part of the redundant information $x_{p1}(k)$ and $x_{p2}(k)$ in the coded data sequence is in general provided in order to produce a higher code rate $R_c$ than ⅓, for example a code rate of $R_c=½$, that is to say two bits of the coded data sequence are associated with one bit of the input sequence $x_s(k)$.

FIG. 2 illustrates a turbo decoder which is used at the mobile radio receiver. In a similar manner to the turbo coder illustrated in FIG. 1, the turbo decoder uses two decoder elements 4 and 5 in order to process the two code components. These are so-called soft-in-soft-out decoders, which are also referred to as SISO decoders. The input and output signals of SISO decoders such as these are not binary-decision signals, but are digital signals with an appropriate amplitude resolution. SISO decoders typically operate using the MAP algorithm (maximum a-posteriori) or the SOVA (Soft Output Viterbi Algorithm). The input and output variables are, in particular, variables based on a LLR representation (LLR: Log-Likelihood Ratio). An LLR variable is a probability statement and is defined as the logarithm of the ratio between the probability of a logic 0 and the probability of a logic 1 (alternatively, the LLR variable is frequently also defined as the logarithm of the ratio between the probability of a logic 1 and the probability of a logic 0). LLR values with positive mathematical signs make it possible to deduce the presence of a logic 0, while LLR values with negative mathematical signs indicate the presence of a logic 1. The magnitude of the LLR value in this case indicates the reliability of the hypothesis of a logic 1 or a logic 0. The greater the magnitude of the LLR value, the more reliable is the hypothesis of a logic 1 or a logic 0.

The turbo decoder receives three sequences $L_s(k)$, $L_{p1}(k)$ and $L_{p2}(k)$ of LLR values which correspond to the transmitted sequence elements $x_s(k)$, $x_{p1}(k)$ and $X_{p2}(k)$. The bits $x_s(k)$ and the sequence $L_s(k)$ are also respectively referred to as systematic bits and systematic LLR values or systematic information. Based on the received LLR sequences $L_s(k)$ and $L_{p1}(k)$ or $L_{p2}(k)$ and on the a-priori LLR values $L_{a1}(k)$ and $L_{a2}(k)$ respectively, generated during the final decoding element, each of the decoder elements 4 and 5 produces two output signals, specifically LLR values $L_{o1}(k)$ and $L_{o2}(k)$, respectively, of so-called a-posteriori information and LLR values $L_{e1}(k)$ and $L_{e2}(k)$, respectively, of so-called extrinsic information. The a-posteriori LLR values $L_{o1}(k)$ and $L_{o2}(k)$ in this case respectively correspond to the uncoded data sequence $x_s(k)$ (see FIG. 1), in which case the mathematical sign of the a-posteriori values $L_{o1}(k)$ or $L_{o2}(k)$ is used to deduce the binary data sequence $x_s(k)$. This procedure is also described by the expression hard decision. The a-posteriori LLR values $L_{o1}(k)$ and $L_{o2}(k)$ are referred to as soft output values of the respective decoder element 4 or 5. The extrinsic information $L_{e1}(k)$ or $L_{e2}(k)$ respectively, is additional information obtained during the respective decoding element, and is used as a-priori information $L_{a2}(k)$ and $L_{a1}(k)$, respectively, during the subsequent decoding element. Furthermore, the respective extrinsic information $L_{e1}(k)$ and $L_{e2}(k)$ describes the convergence of the decoding process.

The following relationship applies to the a-posteriori information $L_{o1}(k)$ and $L_{o2}(k)$, respectively:

$$L_{o1}(k)=L_s(k)+L_{a1}(k)+L_{e1}(k) \quad \text{(Equation 1)}$$

$$L_{o2}(k)=L_s(k)+L_{a2}(k)+L_{e2}(k) \quad \text{(Equation 2).}$$

Since an interleaver 3 (see FIG. 1) is provided in the turbo coder, two deinterleavers 6 and 7 as well as two interleavers 8 and 9 are used in the turbo decoding process.

The turbo decoding is carried out iteratively. In this case, the extrinsic values $L_{e2}(k)$ of the decoder element 5 during the iteration i are fed back to the SISO decoder element 4 as a-priori values $L_{a1}(k)$ for the iteration i+1. At the start of the decoding process, the a-priori values $L_a1(k)$ are set to 0, since there is an equal probability of the transmission of a logic 0 or a logic 1. During the last iteration, the a-posteriori values $L_{o2}(k)$ of the second decoder element 5 are introduced by means of the deinterleaver 7 into the originally transmitted bit sequence, resulting in the LLR values $L'_{o2}(k)$. A hard decision based on these values $L'_{o2}(k)$ results in the uncoded transmission-end data sequence $x_s(k)$ (see FIG. 1).

FIG. 3 shows an alternative refinement of a turbo decoder. Blocks and signals which are provided with the same reference symbols in FIG. 2 and FIG. 3 correspond to one another. In this embodiment, the second decoder element 5' has no input for reception of the systematic LLR values $L_s(k)$. In this situation, the a-priori information $L_{a2}(k)$ of the second decoder element 5' is obtained from the sum of the extrinsic information $L_{e1}(k)$ of the first decoder element 4 and the systematic information $L_s(k)$. In contrast to this, the a-priori information $L_{a1}(k)$ of the first decoder element 4 corresponds to the extrinsic information $L_{e2}(k)$ of the second decoder element 5'. This refinement also makes use of the fact that the sum $L_{e1}(k)+L_s(k)$ is equivalent to the difference $L_{o1}(k)-L_{a1}(k)$ and the variable $L_{e2}(k)$ is equivalent to the difference $L_{o2}(k)-L_{a2}(k)$. It is also possible to provide in an analogous manner (not illustrated) for the first decoder element rather than the second decoder element not to have an input for reception of the systematic LLR values $L_s(k)$, in which case the a-priori information $L_{a1}(k)$ of the first decoder element is obtained from the sum of the extrinsic information $L_{e2}(k)$ of the second decoder element and the systematic information $L_s(k)$.

Provided that the decoding process has not yet converged, the reliability of the a-posteriori information $L_{o1}(k)$ and $L_{o2}(k)$ typically increases in each iteration, that is to say the magnitude of the LLR values $L_{o1}(k)$ and $L_{o2}(k)$ becomes greater If the decoding process has already converged, further iterations, for example when using a fixed predetermined number of iterations for decoding, result only in additional computation effort and thus additional wastage of performance without increasing the reliability of the decoding. In a decoding method which operates particularly efficiently, the number of iterations should thus be adaptively matched to the reception conditions.

A large number of different termination conditions are known from the prior art for adaptive matching of the number of iterations. These termination conditions are in this case based on the checking of the information obtained during the decoding process, that is to say typically on the a-posteriori information $L_{o1}(k)$ or $L_{o2}(k)$, respectively, the extrinsic information $L_{e1}(k)$ or $L_{e2}(k)$, respectively, or the a-priori information $L_{a1}(k)$ or $L_{a2}(k)$, respectively, with these information items also being referred to as decoding parameters.

The termination criteria which are known from the prior art can be subdivided into two types:

a) so-called hard-decision-based termination criteria, and
b) so-called soft-decision-based termination criteria.

Furthermore, the termination criteria from the prior art as described in the following text differ in that these can either only identify that the decoding process has converged or else they can additionally confirm that the decoding process is diverging, that is to say it is not possible to decode the received block within a predetermined number of iterations.

In the following text, the variables $L_o^i(k)$, $L_e^i(k)$ and $L_a^i(k)$ denote the LLR values of the a-posteriori information, of the extrinsic information and of the a-priori information, respectively, for the half-iteration i. In this case, a half-iteration corresponds to one decoding element.

The decision variables for the hard-decision-based termination criteria are obtained as a function of binary-decision bits in the decoding parameters.

One typical representative of the hard-decision-based termination criteria is the so-called HDA criterion (HDA—hard decision aided), which is described in the document "Two Simple Stopping Criteria for Turbo Decoding", R. Y. Shao et al., IEEE Transactions on Communications, Vol. 67, No. 8, August 1999, pages 1117 to 1120. The HDA criterion is based on the evaluation of the binary-decision bit sequence of the a-posteriori information $L_o^i(k)$. The turbo decoding is terminated when:

$$sgn(L_o^i(k))=sgn(L_o^{i-1}(k)) \forall k \in (1 \ldots K) \quad \text{(Equation 3)}.$$

In this case, the variable K describes the number of systematic bits in the data block. The turbo decoding is thus terminated when all of the binary-decision bits of the a-priori information $L_o^i(k)$ in the half-iteration i match all of the binary-decision bits of the a-priori information $L_o^{i-1}(k)$ from the previous half-iteration i−1. Alternatively, the binary-decision bits of the a-posteriori information of a decoder element 4 or 5 can also be compared from two successive (complete) iterations.

A further hard-decision-based termination criterion is represented by the so-called GHDA criterion (GHDA—generalized hard decision aided). The GHDA criterion is a generalization of the HDA criterion. The GHDA criterion is described in the document "Generalised stopping criterion for iterative decoders", Electronic Letters, Vol. 39, No. 13, June 2003, pages 993 and 994. The GHDA criterion is based on the determination of the number of mathematical sign discrepancies between the LLR values $L_o^i(k)$ and $L_o^{i-1}(k)$ of the a-posteriori information for two successive half-iterations (or alternatively for two successive iterations) for the entire data block. The turbo decoding process is then interrupted when the number of mathematical sign discrepancies is less than or equal to a first threshold value $\theta_1$. In this case, the turbo decoding process is already converging sufficiently. Furthermore, the turbo decoding process is terminated when the number of mathematical sign discrepancies is greater than or equal to a second threshold value $\theta_2$, in which case the second threshold value $\theta_2$ is greater than the first threshold value $0_1$. Compliance with this second termination condition indicates that the turbo decoding process is diverging, that is to say reliable decoding of the received data block is not possible within a predetermined number of iterations. This allows a block decoding process which promises to be unsuccessful to be terminated at an early stage during the decoding process.

On the other hand, the GHDA criterion has the disadvantage that the decision bits of the a-posteriori information $L_o^{i-1}(k)$ of the last half-iteration i−1 (or alternatively the last iteration) must be temporarily stored for the mathematical sign comparison. A memory with a memory size of K bits is required for temporary storage, where K corresponds to the number of systematic bits in a data block.

A further hard-decision-based termination criterion, specifically the so-called SDR criterion (SDR—sign difference ratio) is described in the document "A Simple Stopping Criterion for Turbo Decoding", Y. Wu et al., IEEE Communications Letters, Vol. 4, No. 8, August 2000, pages 258 to 260. The SDR criterion is used to define a decision function which indicates the number of mathematical sign discrepancies between the values $L_a^i(k)$ of the a-priori information and the values $L_e^i(k)$ of the extrinsic information in each half-iteration (or alternatively in each iteration). The turbo decoding process is terminated if the value of the decision function $E^i$ for a half-iteration i (or alternatively for an iteration i) is less than or equal to a predefined threshold value 0. The decision function $E^i$ may be indicated in the following form:

$$E^i = \frac{1}{K}\sum_{k=1}^{K} f^i(k) \text{ where } f^i(k) = \begin{cases} 0 & \text{if } sgn(L_a^i(k)) = sgn(L_e^i(k)) \\ 1 & \text{if } sgn(L_a^i(k)) \neq sgn(L_e^i(k)) \end{cases}. \quad \text{(Equation 4)}$$

A further half-decision-based termination criterion which is based on carrying out a cyclic redundancy check (CRC) is known from the document "Reducing Average Number of Turbo Decoding Iterations", Electronic Letters, Vol. 35, No. 9, April 1999, pages 701 and 702. A CRC checking pattern (parity bits) is in each case attached to the uncoded payload data, which is obtained as the division remainder from a polynomial division of the payload data polynomial by a generator polynomial. During a CRC, a check is carried out in the receiver to determine whether the received payload data and the received CRC checking pattern match one another. In the case of the CRC termination criterion, a CRC is carried out with respect to the turbo-decoded signal, that is to say with respect to the binary-decision bit sequence of the a-posteriori information $L_o^i(k)$. In this case, the CRC can be carried out during each iteration. The turbo decoding process is terminated when using this termination criterion when the CRC is correct. The probability of incorrect termination depends on the length of the generator polynomial. In this case, the probability decreases as the length of the generator polynomial increases.

In the case of soft-decision-based termination criteria, a metric relating to non-binary-decision decoding parameters is compared with a predefined threshold value.

One example of a soft-decision-based termination criterion is represented by the so-called sum criterion (SUM criterion), which is described in the document "Low Complexity Stopping Criteria for UMTS Turbo-Decoders", F. Gilbert et al., Vehicular Technology Conference, Vol. 4, April 2003, pages 2376 to 2380. In the case of this criterion, the sum $S^i$ of the magnitudes of the a-posteriori information is determined after each half-iteration i (or alternatively after each iteration) using the following equation:

$$S^i = \sum_{k=1}^{K} |L_o^i(k)|. \qquad \text{(Equation 5)}$$

The turbo decoding process is terminated if the following relationship is satisfied:

$$S^i - S^{i-1} \leq 0. \qquad \text{(Equation 6)}.$$

In this case, the presence of the condition in accordance with Equation 6 indicates, inter alia, that the decoding process is diverging, that is to say the respective data block cannot be decoded within a maximum number of iterations.

A further representative of a soft-decision-based termination criterion is the so-called minimum criterion (MIN criterion), which is described in the documents "Decoding Metrics and their Application in VLSI Turbo Decoders", Z. Wang et al., Proc. 2000 Conference on Acoustics, Speech, and Signal Processing (ICASSP 00), September 2000, pages 3370 to 3373, and "Stopping Rules for Turbo Decoders", A. Matache et al., TMO Progress Report 42-142, August 2000, http:///tda.jpl.nasa.gov/progress report/, Jet Propulsion Laboratory, Pasadena. In this case, the minimum of the magnitude of the soft output values $L_o^i(k)$ is determined after each half-iteration i (or alternatively after each iteration) using the following calculation rule:

$$\delta_i = \min |L_o^i(k)| \qquad \text{(Equation 7)}.$$

$$1 \leq k \leq K$$

The turbo decoding process is terminated when $\delta_i$ is greater than a predefined threshold value $\theta$.

It is also known from the document that has already been cited above "Low Complexity Stopping Criteria for UMTS Turbo-Decoders" for the SUM criterion and the MIN criterion to be combined as a SUM-MIN criterion. The turbo decoding process is terminated as soon as one of the two individual criteria is satisfied. In this case, the SUM-MIN criterion uses not only the capability of the SUM criterion to identify the divergence of the decoding process, but also the capability of the MIN criterion to confirm the convergence of the decoding process.

During extensive comparative simulations using different values for the signal-to-noise ratio, it was found that, when using the GHDA criterion, the mean number of iterations of a turbo decoding process actually carried out is at its lowest in comparison to other termination criteria from the prior art, on average, in particular for low values of the signal-to-noise ratio. This means that the use of the GHDA criterion minimizes the computation effort and thus also the power consumption for turbo decoding. As already stated above, however, an additional buffer store with a size of K bits is required to hold the decision bits from the last half-iteration (or iteration) when using the GHDA criterion.

SUMMARY

One object of the present invention is therefore to specify a method for termination of turbo decoding which has comparable performance to the GHDA criterion that is known from the prior art, but without any need for an additional buffer store for holding decision bits from the last half-iteration (or iteration). A further aim of the invention relates to a turbo decoding method which uses the method for termination. A further object of the invention is to specify an apparatus which corresponds to the method for termination for termination of turbo decoding, as well as a turbo decoder which includes the apparatus for termination.

The objects on which the invention is based can be achieved by a method for termination of turbo decoding of received data, with the turbo decoding of the data being carried out iteratively comprising two decoding elements per iteration, the method comprising the following steps:

a) provision
 of a plurality of first log-likelihood ratio values of a-priori information or of a variable which is associated with the a-priori information, and
 of a plurality of second log-likelihood ratio values of extrinsic information or of a variable which is associated with the extrinsic information for one of the two decoding elements, with the first and the second values being associated with the same systematic bits of the received data;

b) determination of a value of a decision variable which is characteristic of the number of mathematical sign discrepancies between the first and the second values, with a mathematical sign discrepancy being present when the mathematical sign of a first value and the mathematical sign of a second value are different for the same systematic bit of the received data;

c) termination of the turbo decoding if the value of the decision variable indicates
 that the number of mathematical sign discrepancies is less than or alternatively at least equal to a first number, or
 that the number of mathematical sign discrepancies is greater or alternatively at least equal to a second number, with the second number being greater than the first number.

For the provision of the first values, the first values can be read from a memory, in which case values of the a-priori information or of a variable which is associated with the a-priori information are also read from this memory in the course of the corresponding decoding element, and for the provision of the second values, the second values can be called up as a function of output values from the same decoding element. A first value can be in each case read from the memory in the method step a) before the same first value is overwritten in the memory by the associated second value for the same systematic bit. The first and the second values of a binary decision can be used in method step b). The value of the decision variable in method step b) can be stated as follows:

$$E = c \cdot \sum_{k=1}^{K} f(k) \text{ where } f(k) = \begin{cases} 0 & \text{if } sgn(L_1(k)) = sgn(L_2(k)) \\ 1 & \text{if } sgn(L_1(k)) \neq sgn(_2(k)) \end{cases},$$

where E describes the decision variable, K the number of systematic bits of the received data, k the index of the systematic bits, c is a constant factor, $L_1(k)$ describes the first values, and $L_2(k)$ describes the second values. The second values can be obtained from the sum of the extrinsic information and systematic information or from the sum of the extrinsic information weighted by a factor and from the systematic information. The steps a) to c) can be carried out both for the first and for the second of the two decoding elements. The method may further comprise the following steps:

a cyclic redundancy check is carried out based on values of the a-posteriori information of one decoding element, with the received data comprising redundance information for a cyclic redundancy check; and the turbo decoding is terminated if the cyclic redundancy check is correct.

A cyclic redundancy check can be carried out just on the basis of values of the a-posteriori information of the first decoding element. The method can be suitable for use in a UMTS mobile radio receiver. A Turbo decoding method can be terminated by means of the above a method. The first and the second decoding element can be carried out using a single decoder element, with the decoder element being operated using time-division multiplexing, and the extrinsic information of the first decoding element or a variable which is associated with this extrinsic information can be stored, and the extrinsic information of the second decoding element or a variable which is associated with this extrinsic information can be stored, using a single memory.

The object can also be achieved by an apparatus for termination of turbo decoding of received data, with the turbo decoding of the data being carried out iteratively comprising two decoding elements per iteration, which receives a plurality of first log-likelihood ratio values of a-priori information or of a variable which is associated with the a-priori information, and a plurality of second log-likelihood ratio values of extrinsic information or of a variable which is associated with the extrinsic information for one of the two decoding elements, with the first and the second values being associated with the same systematic bits of the received data, and which comprises: a means for determination of a value of a decision variable, in which case the decision variable is characteristic of the number of mathematical sign discrepancies between the first and the second values, with a mathematical sign discrepancy, being present when the mathematical sign of a first value and the mathematical sign of a second value are different for the same systematic bit of the received data, and a means for termination of the turbo decoding if the value of the decision variable indicates that the number of mathematical sign discrepancies is less than or alternatively at least equal to a first number, or that the number of mathematical sign discrepancies is greater or alternatively at least equal to a second number, with the second number being greater than the first number.

The first values can be read from a memory, in which case values of the a-priori information or of a variable which is associated with the a-priori information are also read from this memory in the course of the corresponding decoding element, and wherein the second values are called up as a function of the result of the same decoding element. The means for determination of a value of a decision variable may comprise a means for binary decision for the first and the second values. The second values can be obtained from the sum of the extrinsic information and systematic information or from the sum of the extrinsic information weighted by a factor and from the systematic information. The apparatus may receive first and second values for both decoding elements.

The apparatus may comprise a means for carrying out a cyclic redundancy check based on values of the a-posteriori information of one of the two decoding elements, with the received data comprising redundancy information for a cyclic redundancy check, and a means for termination of the turbo decoding if the cyclic redundancy check is correct. The apparatus can be suitable for use in a UMTS mobile radio receiver. A Turbo decoder may comprise such an apparatus for termination of the turbo decoding. The turbo decoder may comprise a single decoder element for both decoding elements with the decoder element being operated using time-division multiplexing, and a single memory which is used to store the extrinsic information of the first decoding element or a variable which is associated with this extrinsic information, and to store the extrinsic information of the second decoding element or a variable which is associated with this extrinsic information.

In the case of the method according to the invention for termination of turbo decoding, a plurality of first LLR values of a-priori information or a variable which is related to the a-priori information are produced for at least one of the two decoding elements. Furthermore, a plurality of second LLR values of extrinsic information, or of a variable which is related to the extrinsic information, are produced for at least the same decoding element. In this case, the first and the second values are associated with the same systematic bits of the received data. Furthermore, a value is defined for a decision variable which is characteristic of a number of mathematical sign discrepancies between the first and the second values. In this case, the decision variable may also directly be the number of mathematical sign discrepancies or, conversely, a number of identical mathematical signs. A mathematical sign discrepancy occurs when the mathematical sign of a first value and the mathematical sign of a second value are different for the same systematic bit of the received data. The turbo decoding is terminated if the value of the decision variable indicates that the number of mathematical sign discrepancies is less than a first number or, in the case of an alternative embodiment of the method, is at least equal to a first number. Furthermore, the turbo decoding is terminated if the number of mathematical sign discrepancies is greater than a second number, or in the case of an alternative embodiment of the method, is at least equal to a second number. Two termination conditions are thus checked. In this case, the second number is greater than the first number. The first and second numbers need not necessarily be integers.

One significant feature of the method according to the invention is that termination methods which are based on the SDR criterion have a second threshold value (corresponding to the second number) added to them. The method according to the invention is thus based on a generalized SDR criterion, with this criterion according to the invention also being referred to in the following text as the GSDR criterion (generalized sign difference ratio). The advantage of the use of a second threshold value is that the divergence of the turbo decoding process can be identified at an early stage during the termination method according to the invention. If the decision variable indicates that the number of mathematical sign discrepancies is greater than the second number, or in an alternative embodiment of the method is at least equal to the second number, then this indicates that the turbo decoding process is diverging, that is to say that reliable decoding of the received data block is not possible within a predetermined number of iterations. This makes it possible to terminate a block decoding process which promises to be unsuccessful at an early stage during the decoding process, without the decoding process unnecessarily requiring further energy.

One major advantage of the method according to the invention is also that, in contrast to the GHDA method, there is no need for additional temporary storage of the first or second LLR values which govern the decision variable. The first values are advantageously read from a memory, in which case the values of the a-priori information or of a variable which is related to the a-priori information are also read from this memory in the course of the corresponding decoding element. The second values are advantageously called on as a function of output values from the same decoding element. The mathematical signs of the first and of the second values can thus be compared effectively "on-the-fly", without any additional buffer store.

In the method according to the invention, it shall be noted that the individual steps of the method which are adjacent to one another in time do not necessarily need to be regarded as separate steps. In particular, it is feasible for only some of the first and second values to be produced for a data block initially, for example for a window of 20 systematic bits, after which the decision variable is updated on the basis of these first and second values, with a further proportion of the first and second values for the data block then being produced, after which the decision variable is updated again. This procedure is then repeated, for example, until all of the first and second values for the entire block have been taken into account. A window-based implementation of the method according to the invention such as this is particularly worthwhile when the SISO decoding element is analogously in the form of a window-based SISO decoding element.

Furthermore, the turbo decoding need not necessarily be terminated directly at the time at which the termination condition is satisfied. For example, it is possible for a further half-iteration of the turbo decoding always to be carried out once the termination condition has been satisfied.

The variable which is associated with the a-priori information or with the extrinsic information is a variable which is dependent either on the a-priori information or on the extrinsic information, respectively, or alternatively is based on the a-priori information or the extrinsic information, respectively. A variable which is associated with the a-priori information or with the extrinsic information is, for example, a variable which differs from the a-priori information or from the extrinsic information, respectively, by the systematic information. In addition, a variable which is associated with the a-priori information or with the extrinsic information represents the a-priori information or extrinsic information weighted by a factor w (by way of example w=0.75). The sum of the weighted a-priori information or of the weighted extrinsic information and of the systematic information is also regarded for the purposes of this application as a variable which is associated with the a-priori information or with the extrinsic information. The extrinsic information is frequently weighted in order to improve the quality of the soft output values from the MAP algorithm or from the SOVA.

In this context, it is known from the document cited above "A Simple Stopping Criterion for Turbo Decoding" for the expected value of the a-priori LLR values or of the extrinsic LLR values to be 5 to 10 times greater than the expected value of the systematic LLR value when the bit error rate is low. By way of example, in the case of the first decoding element 4 in the turbo decoding process shown in FIG. 3, the mathematical signs of the LLR values $L_{e1}(k)+L_s(k)$ which result from the sum of the extrinsic information $L_{e1}(k)$ and of the systematic information $L_s(k)$ can be compared with the mathematical signs of the associated LLR values $L_{a1}(k)$ of the a-priori information. Alternatively, this can also be carried out in an analogous manner for the second decoding element 5. Furthermore, instead of the sum of the extrinsic information $L_{e1,2}(k)$ and of the systematic information $L_s(k)$, it is also possible to base the comparison on the sum of the extrinsic information $w \cdot L_{e1,2}(k)$ weighted by a factor, and of the systematic information $L_s(k)$.

For the provision of the first and second LLR values, a first value is advantageously in each case read from the memory before the same first value in the memory is overwritten by the associated second value for the same systematic bit.

In one typical implementation of the turbo decoder, a memory is provided for storage of the a-priori information $L_{a1}(k)$ and $L_{a2}(k)$. Individual LLR values $L_{e1}(k)$ and $L_{e2}(k)$, respectively, of the extrinsic information or of a variable (for example $L_{e1,2}(k)+L_s(k)$ or $w \cdot L_{e1,2}(k)+L_s(k)$) which is dependent on them are/is calculated as a function of the respective a-priori information $L_{a1}(k)$ or $L_{a2}(k)$ in each decoding element and are written to the same memory, with the associated LLR values $L_{a1}(k)$ and $L_{a2}(k)$ of the a-priori information being overwritten. The stored LLR values then form the LLR values $L_{a2}(k)$ and $L_{a1}(k)$ for the a-priori information for the next decoding element in time.

The first LLR values and the second LLR values are advantageously subjected to a binary decision during the determination of the decision variable. The binary decision is in this case dependent on the mathematical sign of the respective LLR value.

In one advantageous embodiment of the method, the value of the decision variable E for one decoding element can be stated as follows:

$$E = c \cdot \sum_{k=1}^{K} f(k) \text{ where } f(k) = \begin{cases} 0 & \text{if } sgn(L_1(k)) = sgn(L_2(k)) \\ 1 & \text{if } sgn(L_1(k)) \neq sgn(L_2(k)) \end{cases} \quad \text{(Equation 8)}$$

In this case, the variable K describes the number of systematic bits in the received data block, the variable k describes the index of the associated systematic bit, the variable c describes a selectable constant factor, and the variables $L_1(k)$ and $L_2(k)$ describe the first and second values, respectively. The decoding method is in this case advantageously terminated when the decision variable E is less than or equal to a first threshold value $\theta_1$ or is greater than or equal to a second threshold value $\theta_2$. The constant factor c may be chosen, for example, to be 1/K or alternatively 1. In the second case (c=1), there is no need for any multiplication or division process; the threshold values $\theta_1$ and $\theta_2$ can then be chosen to be greater by the factor K than in the first case (c=1/K).

It is advantageous for the method for termination of turbo decoding to be carried out both with respect to the first of the two decoding elements and with respect to the second of the two decoding elements. In this case, the presence of the termination condition is checked during each half-iteration. The advantage of this measure is that the turbo decoding method is terminated at the earliest possible time. Furthermore, if the turbo decoder has a single SISO decoder which is switched backwards and forwards using a time-division multiplexing process between the two decoding elements, it is worthwhile carrying out both half-iterations in as similar a manner as possible in one iteration. In this sense, the presence of the termination condition should also be checked for both decoding elements.

In one advantageous refinement of the termination method according to the invention, a CRC is additionally carried out, based on values of the a-posteriori information of one decoding element. The resultant combined termination criterion is referred to in the following text as the GSDR-CRC criterion. The turbo decoding is in this case also terminated if the CRC is correct. The GSDR criterion according to the invention need not be satisfied in this case. The combination of the GSDR criterion with a CRC-based termination criterion makes it possible to further increase the performance of the termination method according to the invention, that is to say the mean number of iterations decreases further, as the following simulation results show, when an additional CRC-based termination criterion is taken into account.

In this case, it is advantageous for a CRC to be carried out only on the basis of values of the a-posteriori information of the first of the two decoding elements. The reason for this is that, for a CRC, the sequence of the decoding bits which are obtained by a binary decision from the LLR values of the a-posteriori information must correspond to the sequence of the original data sequence $x_s(k)$ (see FIG. 1). Since the LLR values are processed in a scrambled sequence in the second decoding element (see the interleavers 8 and 9 in FIG. 2), the a-posteriori LLR values $L_{o2}(k)$ which result from the second decoding element also have their sequence scrambled. For this reason, the a-posteriori LLR values $L_{o2}(k)$ from the second decoding element would first of all have to be changed to the transmitted sequence in the course of a deinterleaving step before the CRC. The a-posteriori LLR values $L_{o2}(k)$ from the second decoding element would have to be temporarily stored for a deinterleaving step such as this. Since, however, the memory that is provided typically holds the extrinsic values and is used only after the last iteration element of the storage of the a-posteriori LLR values $L_{o2}(k)$ of the second decoding element, an additional memory would be necessary. There is no need for a memory such as this if only one CRC based on the a-posteriori LLR values $L_{o1}(k)$ from the first decoding element is carried out in each iteration. In this case, however, the presence of the GSDR criterion according to the invention can be checked in each half-iteration. In this context, it should be noted that the use of small cache memories may be necessary or advantageous in some circumstances, in order to allow the CRC to be carried out effectively "on-the-fly". This is the case in particular when the a-posteriori LLR values—as is normally the case with some decoding algorithms—are emitted from the decoding element in the reverse sequence. Furthermore, the parity bits of the CRC checking pattern are generally in the reverse sequence in the UMTS-3GPP Standard. The cache memory can then be used to reverse the sequence again. The size of the cache memory depends on the window size of the decoding algorithm. The size of the cache memory should typically correspond approximately to the window size for the determination of the LLR values; normal window sizes for the UMTS-3GPP Standard are 20 to 40 bits.

The invention also relates to a turbo decoding method which is terminated by means of the method described above.

The first and the second decoding elements in the turbo decoding method are advantageously carried out using a single decoder element. The decoder element is in this case operated using time-division multiplexing. Furthermore, a single memory is used to store the extrinsic information of the first decoding element or a variable which is associated with this extrinsic information, and to store the extrinsic information of the second decoding element, or a variable which is associated with this extrinsic information. The provision of a single decoder element and of a single memory for carrying out both decoding elements allows the turbo decoding method to be carried out with little complexity.

A further aspect of the invention relates to the apparatus according to the invention for termination of turbo decoding. The apparatus receives a plurality of first LLR values of a-priori information or of a variable which is associated with the a-priori information for at least one of the two decoding elements. Furthermore, the apparatus is fed with a plurality of second LLR values of extrinsic information, or of a variable which is associated with the extrinsic information, for at least the same decoding element. The first and the second values are in this case associated with the same systematic bits of the received data. The apparatus has a means for determination of a value of a decision variable, in which case the decision variable is characteristic of a number of mathematical sign discrepancies between the first and the second values. Furthermore, the apparatus has a means for termination of the turbo decoding. The means for termination of the turbo decoding is designed such that it terminates the turbo decoding if the value of the decision variable indicates that the number of mathematical sign discrepancies is less than a first number, or in an alternative refinement, is at least equal to a first number. Furthermore, the means for termination of the turbo decoding is designed in such a way that it also terminates the turbo decoding if the number of the mathematical sign discrepancies is greater than a second number, or in an alternative refinement is at least equal to a second number. In this case, the second number is greater than the first number.

The above statements relating to the termination method according to the invention can be transferred in an analogous manner to the apparatus according to the invention for termination of turbo decoding.

The invention also relates to a turbo decoder which includes the apparatus according to the invention for termination of turbo decoding.

BRIEF DESCRIPTION OF THE DRAWINGS

The invention will be explained in more detail in the following text using a plurality of exemplary embodiments and with reference to the drawings, in which.

Figure 1:
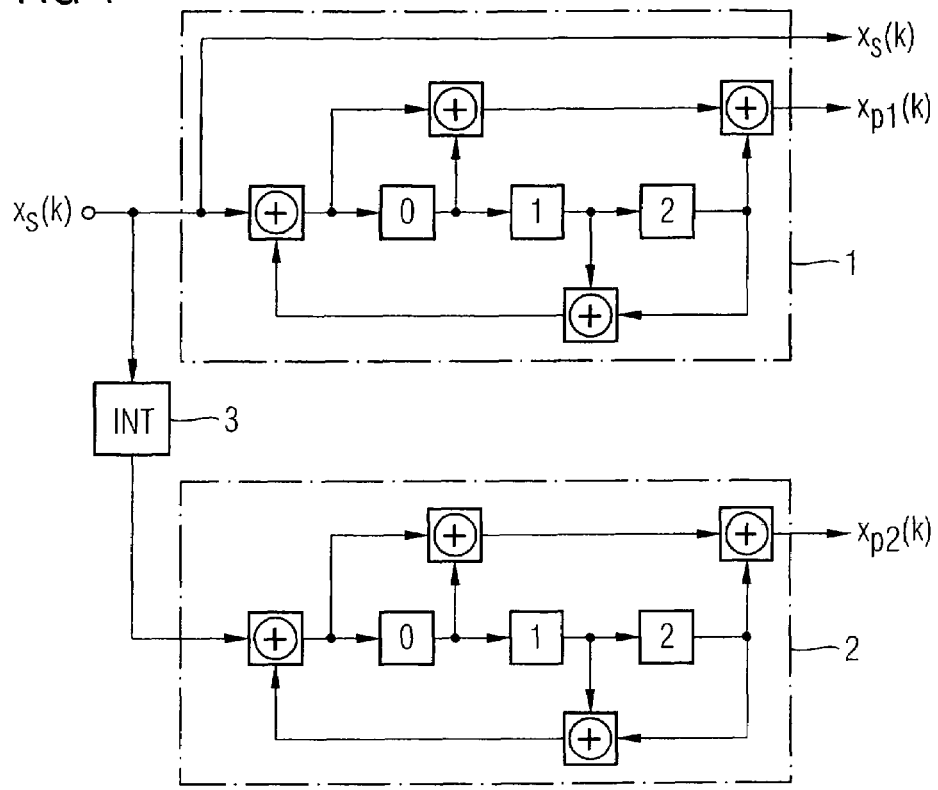
FIG. 1 shows a block diagram of a turbo decoder based on the UMTS-3GPP Standard (prior art)
Figure 2:
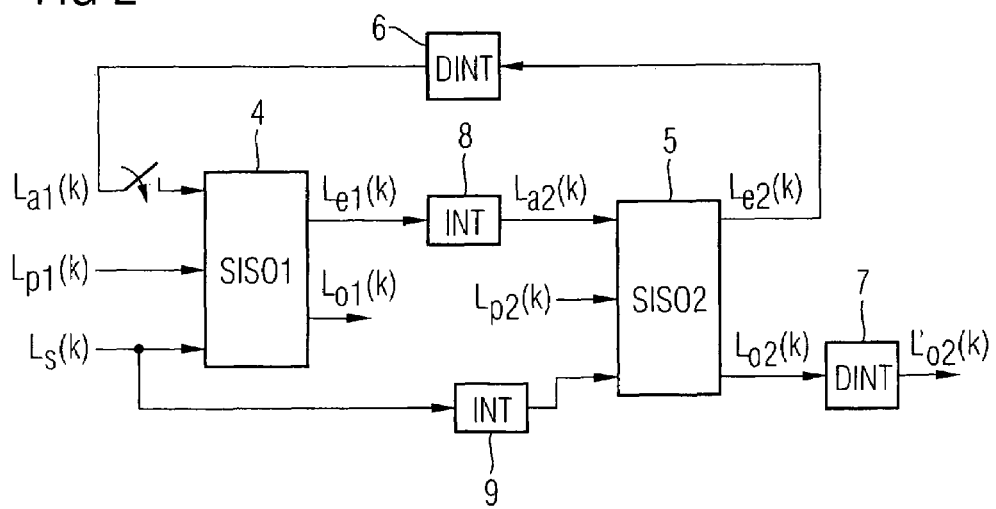
FIG. 2 shows a block diagram of a turbo decoder (prior art)
Figure 3:
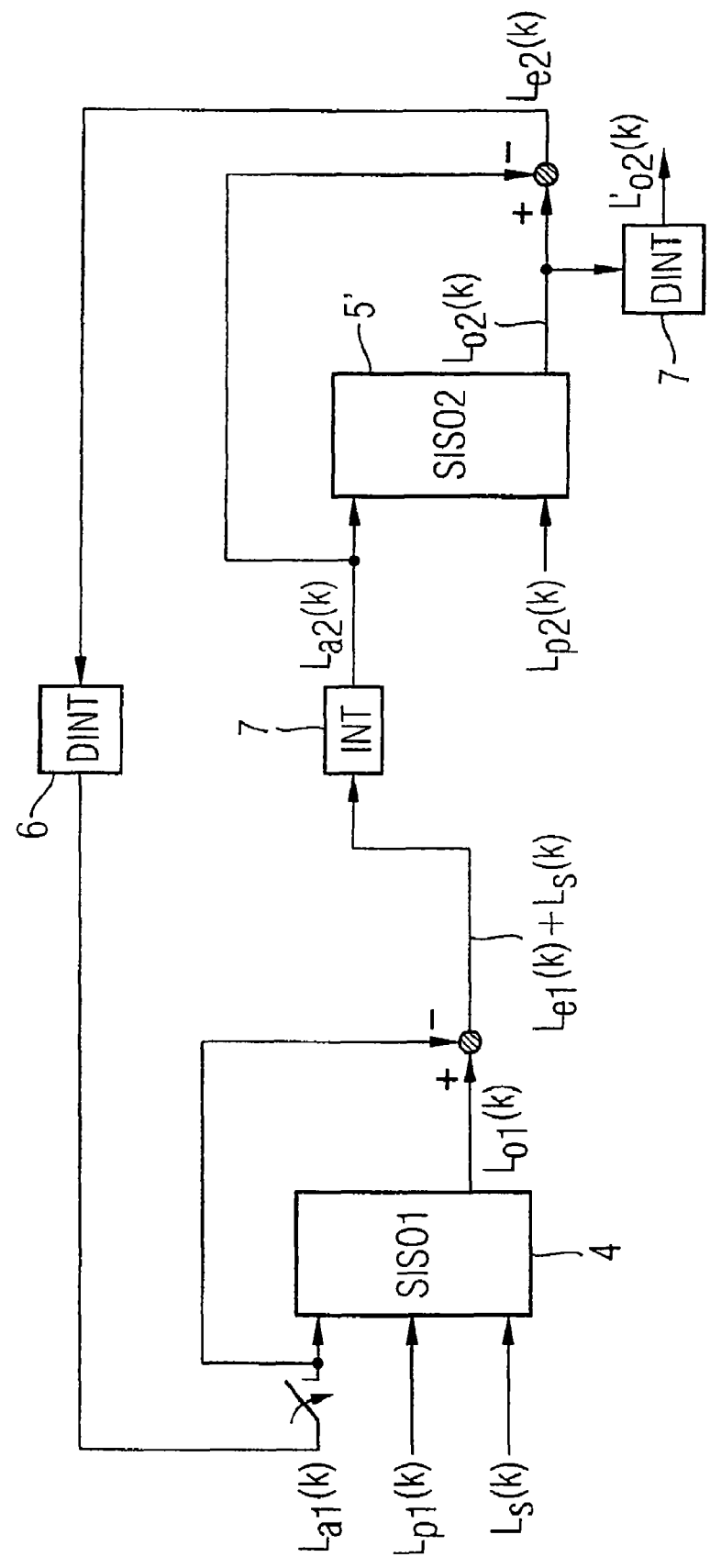
FIG. 3 shows a block diagram of an alternative refinement of a turbo decoder (prior art)

With regard to FIGS. 1 to 3, reference should be made to the description introduction.

DETAILED DESCRIPTION

Figure 4:
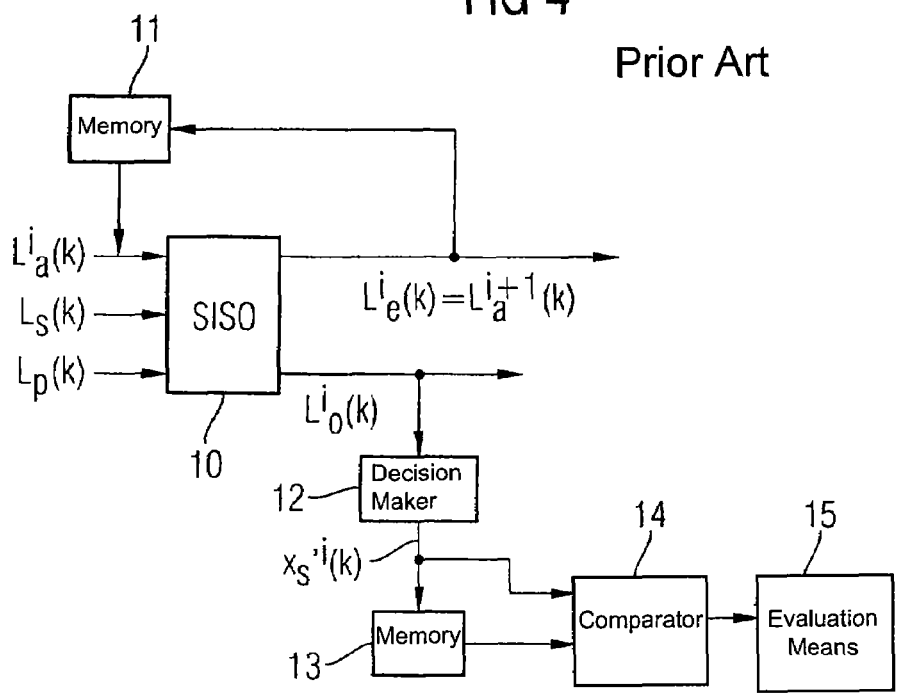
FIG. 4 shows a block diagram relating to the implementation of the GHDA termination criterion in a turbo decoder (prior art)

FIG. 4 shows a block diagram relating to the implementation of the GHDA termination criterion, as is known from the prior art, in a turbo decoder. The turbo decoder has a SISO decoder element 10 which is operated using time-division multiplexing, and carries out the function of the two decoder elements 4 and 5 from FIG. 2 alternately. For this reason, the LLR value indices which indicate the respective decoding step element have been omitted in the following text.

Furthermore, a memory 11 is provided with a memory size of K·Q bits (K: number of systematic bits in a block; Q: word length of the LLR values) for storage of the extrinsic LLR values $L_e^i(k)$ for the half-iteration i. The stored extrinsic LLR values $L_e^i(k)$ are read again as a-priori LLR values $L_a^{i+1}(k)$ by the decoder element 10 from this memory 11 in the next half-iteration i+1. The function of the interleaver 8 shown in FIG. 2 is provided by the stored extrinsic LLR values $L_e^i(k)$ being read in the next iteration in an interleaved manner, that is to say not in the original sequence, from the memory 11 as a-priori LLR values $L_a^{i+1}(k)$. Alternatively, the extrinsic LLR values $L_e^i(k)$ could also be stored in an interleaved sequence at this stage, and could subsequently be read in the stored sequence. The function of the deinterleaver 6 shown in FIG. 2 is implemented by the a-priori LLR values $L_a^{i+1}(k)$ being read, or alternatively the extrinsic LLR values $L_e^i(k)$ being written, in the inverse manner to the interleaving step described above.

The decoder element 10 determines a-posteriori LLR values $L_o^i(k)$ as a function of the a-priori LLR values $L_a^i(k)$ of the systematic LLR values $L_s(k)$ and of the LLR values $L_p(k)$ which are associated with the redundant information. The a-posteriori LLR values $L_o^i(k)$ are fed to a binary decision maker 12 which assigns either a logic 0 (if the mathematical sign is positive) or a logic 1 (if the mathematical sign is negative) to each a-posteriori LLR value $L_o^i(k)$ depending on the mathematical sign. The resultant bit sequence $x_s^i(k)$ is stored with a bit length of K bits in a further memory 13 with a memory size of K bits. In the next half-iteration i+1, a bit sequence $x_s^{i,1}(k)$ of K bits is generated in the same manner at the output of the binary decision maker 12, with the bits of the stored bit sequence $x_s^i(k)$ being compared bit-by-bit with the bits of the updated bit sequence $x_s^{i+1}(k)$ in a bit comparator 14. The comparison result is passed to an evaluation means 15. The evaluation means 15 determines the total number of bit discrepancies for the entire data block. If the number of bit discrepancies between mutually associated bits in the stored bit sequence $x_s^i(k)$ and the updated bit sequence $x_s^{i+1}(k)$ is greater than or less than a specific upper limit (divergence of the turbo decoding), or a specific lower limit (convergence of the turbo decoding), termination of the turbo decoding process is initiated.

Updating the memory contents of the memories 11 and 13 and the bit comparison can be carried out in time with the data bits or in time with a data block or a data window (one block comprises a plurality of windows).

As already stated above, the use of the GHDA criterion for termination of the turbo decoding process has the disadvantage that an additional memory 13 is generally required.

Figure 5:
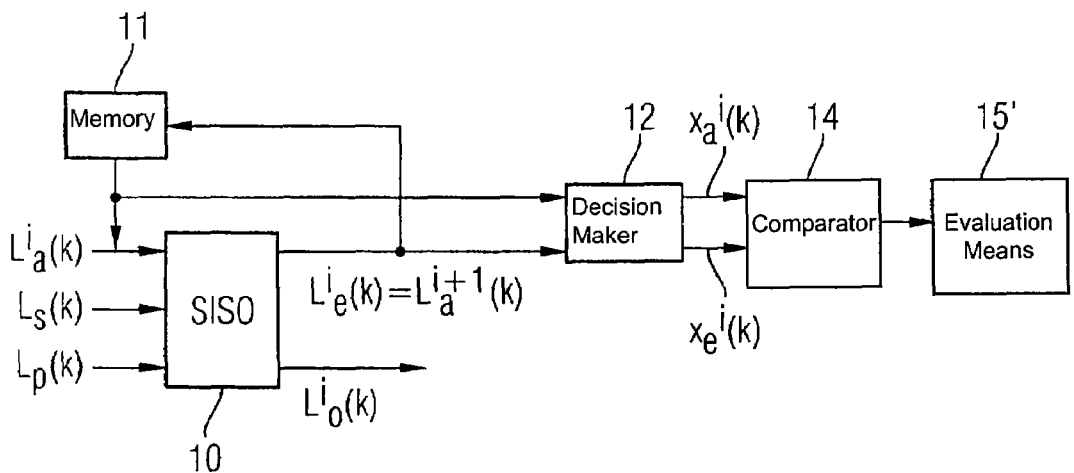
FIG. 5 shows a block diagram relating to the implementation of the GSDR termination criterion according to the invention in a turbo decoder.

FIG. 5 shows a block diagram relating to the implementation of the GSDR termination method according to the invention in a turbo decoder. Blocks and signals provided with the same reference symbols in FIG. 4 and FIG. 5 correspond to one another. The decoder element 10 determines extrinsic LLR values $L_e^i(k)$ as a function of the a-priori LLR values $L_a^i(k)$, the systematic LLR values $L_s(k)$ and the LLR values $L_p(k)$ associated with the redundant information. As soon as an extrinsic LLR value $L_e^i(k)$ which corresponds to the a-priori LLR value $L_a^{i+1}(k)$ for the next half-iteration i+1 has been calculated in the decoder element 10, it is supplied to the binary decision maker 12. The resultant binary-decision bit $x_e^i(k)$ is compared with the binary-decision bit $x_a^i(k)$ of the associated a-priori LLR value $L_a^i(k)$ stored in the memory 11, with this comparison process being carried out in the bit comparator 14, before the a-priori LLR value $L_a^i(k)$ is overwritten by the associated LLR value $L_e^i(k)$. The comparison result is passed to the evaluation means 15'. The evaluation means 15' determines the total number of bit discrepancies between the individual bits in the sequences $x_e^i(k)$ and $x_a^i(k)$ for the entire data block with the block length K.

Termination of the turbo decoding process is initiated as soon as the number of bit discrepancies exceeds a specific upper limit (divergence of the turbo decoding) or the number of bit discrepancies falls below a specific lower limit (convergence of the turbo decoding).

The memory contents of the memory 11 can be updated, and the bit comparison can be carried out, in time with the data bits or in time with a data block or a data window. For the purposes of the invention, it is thus feasible to process a plurality of extrinsic LLR values $L_e^i(k)$ and a plurality of a-priori LLR values $L_a^i(k)$ which are associated with one window in an associated form. Small cache memories may be provided for data processing (not illustrated).

In contrast to the illustration shown in FIG. 5, the a-priori values $L_a^i(k)$ can also be read from a cache memory which is formed by the decoder element 10 and is used, for example, for temporary storage of the a-priori values $L_a^1(k)$ of a data window.

The advantage of the termination of the turbo decoding process according to the invention as shown in FIG. 5 in comparison to the termination as described in FIG. 4 is that the decision bits are compared effectively "on-the-fly", thus making it possible to save an additional buffer store.

In a corresponding manner to the embodiment of the turbo decoder as illustrated in FIG. 3, it is feasible for the purposes of the invention to store the sum of the LLR values $L_{e1}^i(k)$ and $L_s(k)$ ($=L_{o1}^i(k)-L_{a1}^i(k)$) rather than the LLR values $L_{e1}^i(k)$ in the memory 11 for the first decoding element, and to feed them to the decision maker 12. Alternatively, the sum of the LLR values $L_{e2}^i(k)$ and $L_s(k)$ ($=L_{o2}^i(k)-L_{a2}^i(k)$) can be stored in the memory 11 rather than the LLR values $L_{e2}^i(k)$ for the second decoding element, and can be fed to the decision maker 12. However, the a-priori values $L_{a1}^i(k)$ in the memory 11 must then be preloaded with the values of the systematic information $L_s(k)$ rather than with the value 0 in each case at the start of the turbo decoding process.

In one preferred embodiment, the memory 11 is also used for temporary storage of the final soft output values $L_o^i(k)$ from which the bits of the transmission sequence $x_s(k)$ are derived by means of a hard decision (not illustrated in FIG. 5). In this case, there is no need for a separate memory for receiving the decision bits of the soft output values $L_o^i(k)$. However, since the new a-priori information $L_a^{i+1}(k)$ is already located in the memory 11 at the time when the termination decision is made, a further half-iteration must always be allowed to elapse after the termination decision has been made, with the soft output values $L_o^{i+1}(k)$ being stored in the memory 11, rather than the extrinsic values $L_e^{i+1}(k)$, in this half-iteration.

Figure 6:
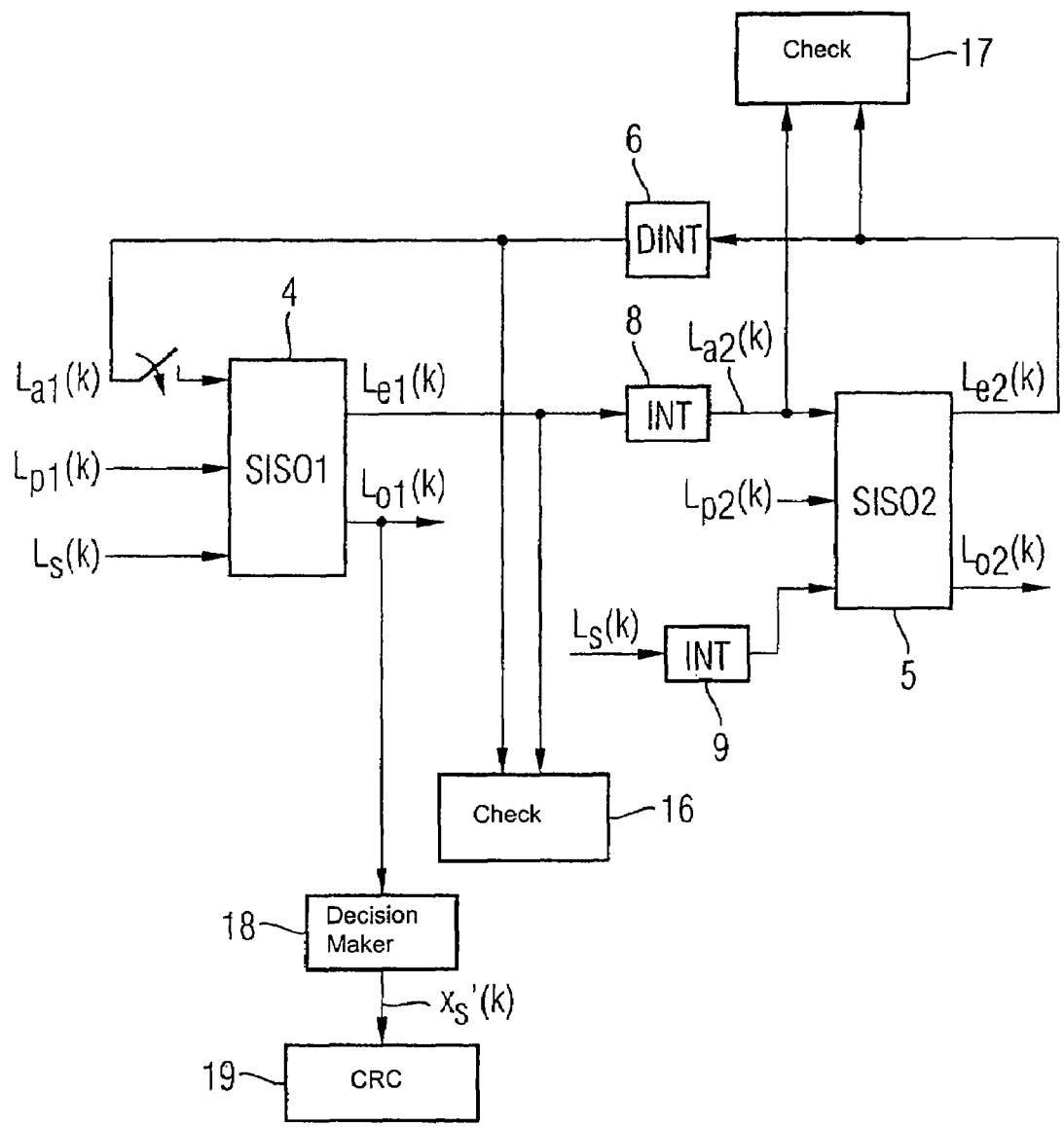
FIG. 6 shows a block diagram relating to the implementation of the GSDR-CRC termination criterion according to the invention in a turbo decoder.

FIG. 6 shows a block diagram relating to the implementation of the GSDR-CRC termination criterion according to the invention. Blocks and signals which are provided with the same reference symbols in FIG. 2 and FIG. 6 correspond to one another. Although FIG. 6 shows two decoder elements 4 and 5, the two decoding elements are preferably carried out using a single decoding element 10, in the manner illustrated in FIG. 4 and FIG. 5. To this extent, the block diagram that is illustrated in FIG. 6 relates more to a flowchart for turbo decoding than to a block diagram of a turbo decoder. A check 16 or 17 of the GSDR termination criterion is carried out in the manner described in conjunction with FIG. 5 for the purposes of the first and second decoding elements.

Furthermore, the a-posteriori LLR values $L_{o1}(k)$ of the first decoding element 4 are subjected to a binary decision 18. A CRC 19 is carried out on the basis of the decision bits $x_s'(k)$. The transmission-end bit sequence $x_s(k)$ (see FIG. 1) already includes CRC parity bits which are attached to the uncoded payload information. Two codes, specifically the CRC code and the turbo code, are thus linked at the transmission end. The CRC code in this case represents the so-called outer code, and the turbo code the so-called inner code. The decision bits $x_s'(k)$ are now just CRC-coded. In the CRC 19, the entire bit sequence $x_s'(k)$, that is to say including the CRC parity bits, is subjected to a polynomial division by the generator polynomial that has already been used at the transmission end. If the CRC is correct, there is no division remainder; the so-called syndrome of the CRC is in this case zero. If the polynomial division is carried out using a shift register chain with feedback, the shift register will be in the zero state after the polynomial division if the CRC is correct, that is to say the outputs of all of the memory elements will be logic 0. If the CRC is correct, the turbo decoding process is terminated.

A CRC could also be carried out in a corresponding manner as a function of the a-posteriori LLR values $L_{o2}(k)$ of the second decoding element 5. As mentioned above, a complex deinterleaving step would, however, be required for this purpose before carrying out the CRC.

In addition, in the case of the implementation of the GSDR-CRC termination criterion, the use of additional cache memories (not illustrated) is generally worthwhile, which are matched to the window size for that decoding element, so that the CRC can be carried out "on-the-fly".

Figure 7A:
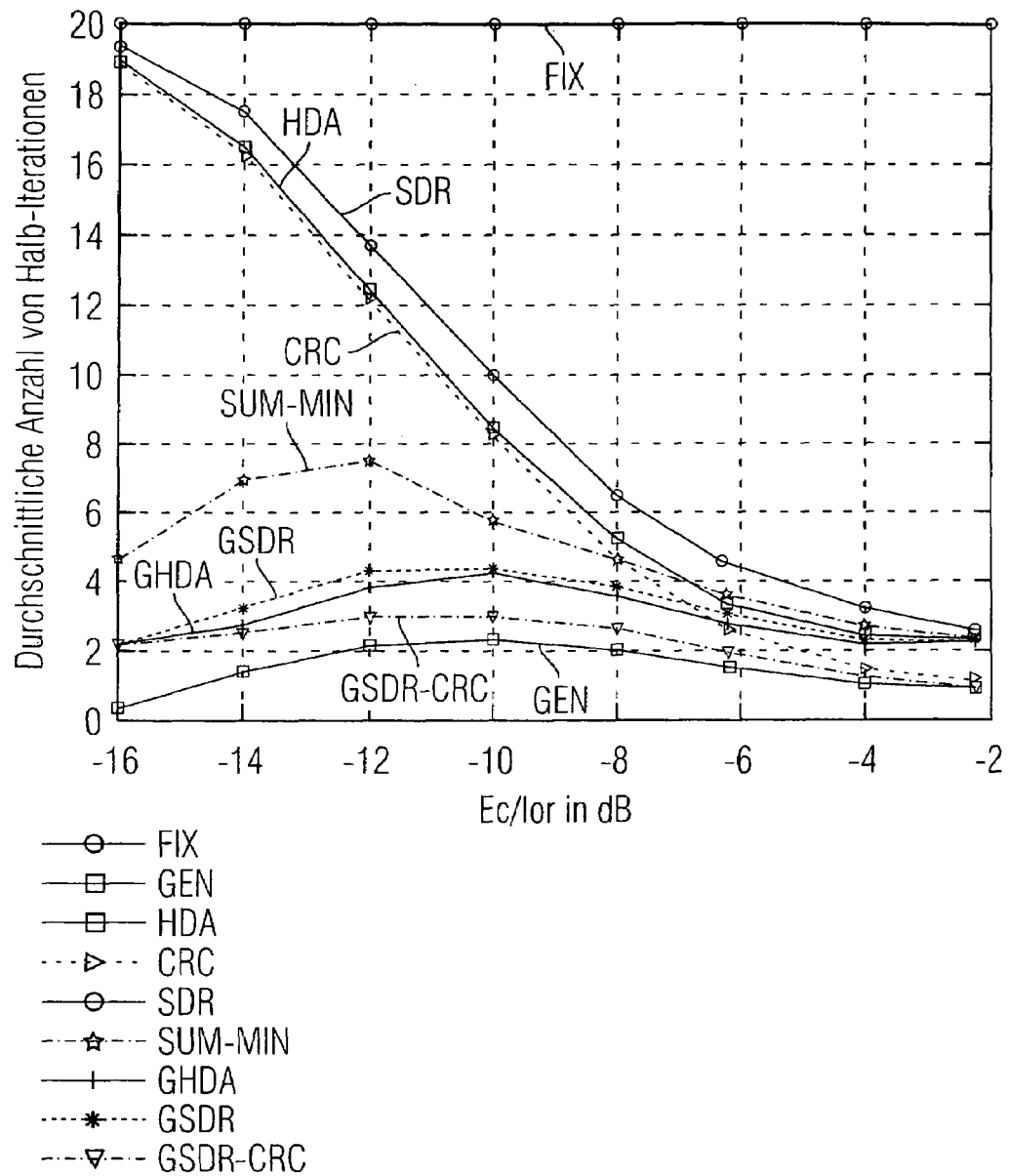
FIG. 7a shows a diagram which illustrates the average number of half-iterations as a function of the signal-to-noise ratio for a number of termination criteria.

FIG. 7a shows a simulation diagram which illustrates the average number of half-iterations as a function of the signal-to-noise ratio $E_c/I_{or}$ ($E_c$—energy per chip; $I_{or}$—overall spectral power density of the base station) for a number of termination criteria. The simulations are based on an FDD downlink transmission (FDD—frequency division duplex) using the 3GPP-UMTS Standard, with a multipath channel at 3 km/h being used as the channel model (case 1, test 4). Furthermore, a 384 kb/s data signal coded using a turbo code is assumed. The length of an uncoded payload data block excluding the CRC redundant information is 3840 bits, with the length of the CRC redundant information being 16 bits. The scrambling length of the interleaver 3 is thus 3856 bits.

A maximum of 20 half-iterations are carried out for all of the termination criteria before the decoding process is terminated. This avoids endless loops.

For the GHDA criterion, the first threshold value $\theta_1$ and the second threshold value $\theta_2$ are chosen to be 0% and 15% respectively. In the simulation based on the SDR criterion, the threshold value $\theta$ is set to 0%. With respect to the MIN criterion, the threshold value $\theta$ is chosen such that it corresponds to half the dynamic range of the a-posteriori LLR values, that is to say the soft output values. In the case of the GSDR criterion according to the invention and the GSDR-CRC criterion according to the invention, the first threshold value $\theta_1$ for the decision variable E (c=1/K) is set to 0%, while the second threshold value $\theta_2$ corresponds to 36%.

FIG. 7a illustrates not only the profiles of the termination criteria mentioned in the description introduction relating to the prior art but also the profiles of two reference termination criteria. These are the so-called fixed criterion (FIX) and the so-called magic genie criterion (GEN).

In the case of the fixed criterion, a fixed number of iterations are generally used for decoding the data blocks, in particular with 20 half-iterations having been used for the present simulations. The achievable block error rate and/or bit error rate with the fixed criterion in each case forms a minimum reference value for the respective signal-to-noise ratio $E_c/I_{or}$.

The magic genie criterion is a termination criterion which cannot be achieved in practice but predetermines the theoretically achievable minimum average number of half-iterations for the respective signal-to-noise ratio $E_c/I_{or}$. In the case of the magic genie criterion, the data block to be decoded is already known before decoding. As soon as the decoded bits correspond to the expected bits of the data block, the decoding process is terminated with the minimum number of half-iterations. In the situation where the data block cannot be detected with the maximum number of half-iterations (in this case 20), the decoding process is not initiated at all.

As can be seen from FIG. 7a, the GSDR termination criterion according to the invention requires a significantly smaller number of half-iterations than the CRC, HDA and SDR criteria for the situation in which data blocks in general cannot be decoded (low signal-to-noise ratio $E_c/I_{or}$). Furthermore, the GSDR criterion according to the invention is superior to the combined SUM-MIN criterion. The average number of half-iterations that result for the GSDR criterion correspond approximately to the number of half-iterations for the GHDA criterion. However, in this case, and in contrast to the GHDA criterion, the GSDR criterion does not require any additional buffer store, as already explained above. The GSDR-CRC criterion according to the invention, which is based on the combination of the GSDR criteria and the CRC criterion, allows the average number of half-iterations to be reduced even further in comparison to the GSDR criterion, in particular in the region of moderate and high signal-to-noise ratios $E_c/I_{or}$.

Figure 7B:
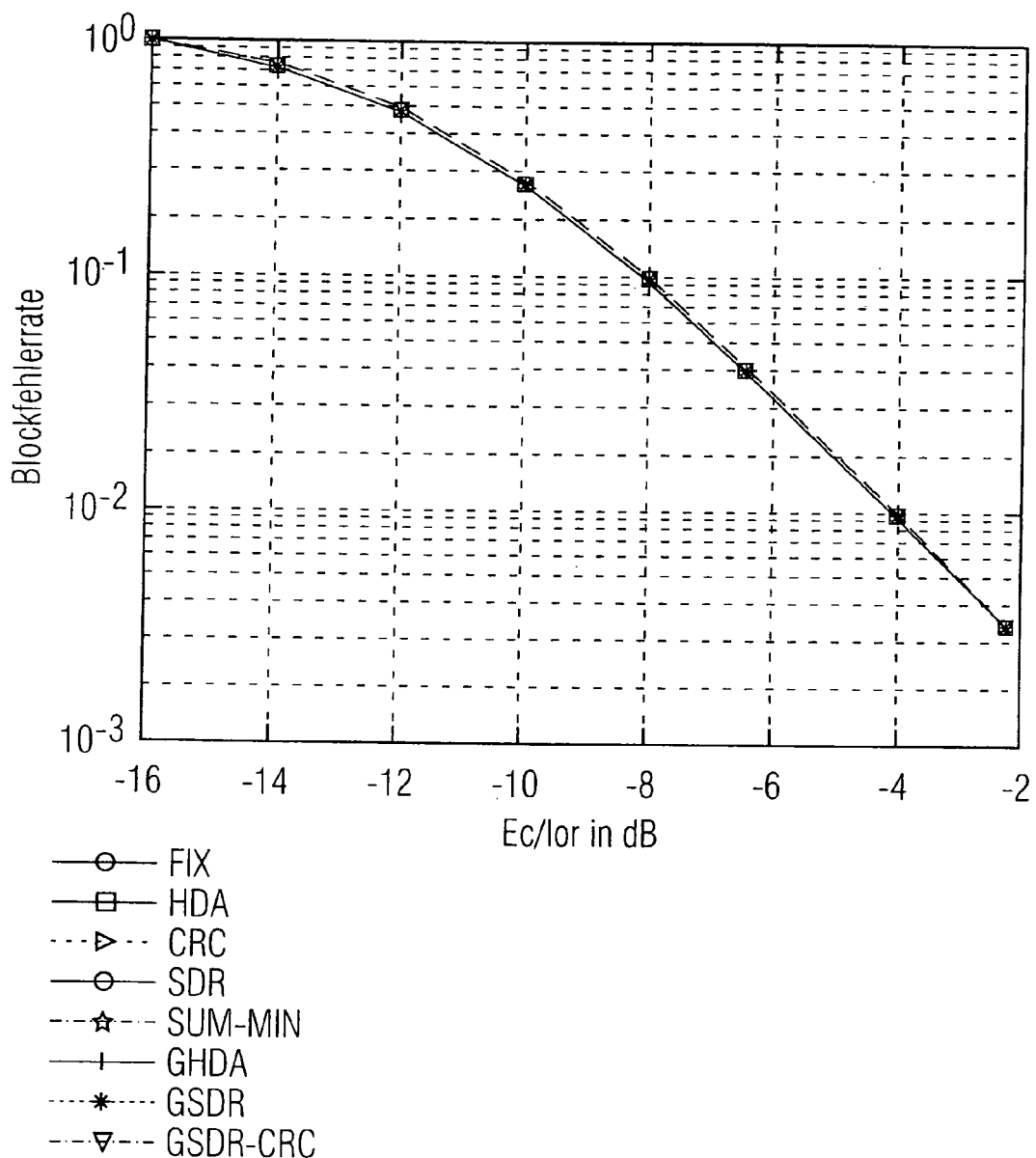
FIG. 7b shows a diagram which illustrates the block error rate as a function of the signal-to-noise ratio for a number of termination criteria.

FIG. 7b shows the simulated block error rate plotted against the signal-to-noise ratio $E_c/I_{or}$ for the termination criteria which have already been mentioned in conjunction with FIG. 7a. As can be seen from FIG. 7b, the simulated values of the block error rate are virtually identical for all the termination criteria, that is to say even for the GSDR criterion according to the invention and the GSDR-CRC criterion according to the invention, and correspond approximately to the reference values of the FIX criterion.

What is claimed is:

1. A method for termination of turbo decoding of received data, wherein said turbo decoding is carried out iteratively comprising two decoding elements per iteration, the method comprising:
reading first values from a memory of the corresponding decoding element, said first values being either a plurality of first log-likelihood ratio values of a-priori information or a variable which is associated with the a-priori information;
calling up second values as a function of output values from the same decoding element, said second values being either a plurality of second log-likelihood ratio values of extrinsic information or a variable which is associated with the extrinsic information for one of the two decoding elements, said first and second values being associated with the same systematic bits of the received data;
determining a value of a decision variable which is characteristic of the number of mathematical sign discrepancies between the first and the second values, wherein a mathematical sign discrepancy is present when the mathematical sign of a first value and the mathematical sign of a second value are different for the same systematic bit of the received data;
terminating the turbo decoding when the value of the decision variable indicates that the number of mathematical sign discrepancies is:
(a) less than or alternatively at least equal to a first number, or
(b) greater than or alternatively at least equal to a second number,
wherein the second number is greater than the first number.

2. The method according to claim 1,
wherein each of the first values is read from the memory before it is overwritten in the memory by the respective second value for the same systematic bit.

3. The method according to claim 1, wherein the first and the second values of a binary decision are used in the determining step.

4. The method according to claim 1, wherein the determining step comprises calculating the value of the decision variable by:

$$E = c \cdot \sum_{k=1}^{K} f(k) \text{ where } f(k) = \begin{cases} 0 & \text{if } sgn(L_1(k)) = sgn(L_2(k)) \\ 1 & \text{if } sgn(L_1(k)) \neq sgn(_2(k)) \end{cases}$$

wherein E represents the decision variable, K represents the number of systematic bits of the received data, k represents the index of the systematic bits, c is a constant factor, $L_1(k)$ describes the first values, and $L_2(k)$ describes the second values.

5. The method according to claim 1, wherein the second values are obtained either from the sum of the extrinsic information and systematic information or from the sum of the extrinsic information weighted by a factor and from the systematic information.

6. The method according to claim 1, wherein the method is executed for both the first and for the second of the two decoding elements.

7. The method according to claim 1, further comprising:
performing a cyclic redundancy check based on values of a-posteriori information of one decoding element, wherein the received data comprises redundancy information for the cyclic redundancy check; and
terminating the turbo decoding if the cyclic redundancy check is correct.

8. The method according to claim 7, wherein the step of performing a cyclic redundancy check is based solely on the values of the a-posteriori information of the first decoding element.

9. The method according to claim 1, wherein the method is suitable for use in a UMTS mobile radio receiver.

10. A turbo decoding method which is terminated by means of the method according to claim 1.

11. The turbo decoding method according to claim 10, wherein the turbo decoding of the first and the second decoding element is performed by a single decoder element using time-division multiplexing, and
wherein the extrinsic information of the first decoding element or a variable which is associated with the extrinsic information, and the extrinsic information of the second decoding element or a variable which is associated with the extrinsic information being stored, are both stored in a single memory.

12. An apparatus for terminating turbo decoding of received data, wherein said turbo decoding is carried out iteratively comprising two decoding elements per iteration, said apparatus comprising:
means for reading first values from a memory of the corresponding decoding element, said first values being either a plurality of first log-likelihood ratio values of a-priori information or a variable which is associated with the a-priori information;
means for calling up second values as a function of the result of the same decoding element, said second values being either a plurality of second log-likelihood ratio values of extrinsic information or a variable which is associated with the extrinsic information for one of the two decoding elements, said first and second values being associated with the same systematic bits of the received data;
means for determining a value of a decision variable, which is characteristic of the number of mathematical sign discrepancies between the first and the second values, wherein a mathematical sign discrepancy is present when the mathematical sign of a first value and the mathematical sign of a second value are different for the same systematic bit of the received data; and
means for terminating the turbo decoding when the value of the decision variable indicates that the number of mathematical sign discrepancies is:
(a) less than or alternatively at least equal to a first number, or
(b) greater than or alternatively at least equal to a second number, wherein the second number is greater than the first number.

13. The apparatus according to claim 12,
wherein the means for determining the value of the decision variable comprises a means for binary decision for the first and the second values.

14. The apparatus according to claim 12, wherein
the second values are obtained either from the sum of the extrinsic information and systematic information or from the sum of the extrinsic information weighted by a factor and from the systematic information.

15. The apparatus according to claim 12,
wherein the apparatus receives the first and the second values for both decoding elements.

16. The apparatus according to claim 12, wherein the apparatus comprises:

means for performing a cyclic redundancy check based on values of a-posteriori information of one of the two decoding elements, wherein the received data comprises redundancy information for the cyclic redundancy check; and means for terminating the turbo decoding if the cyclic redundancy check is correct.

17. A UMTS mobile radio receiver comprising the apparatus according to claim 12.

18. A turbo decoder comprising the apparatus according to claim 12.

19. The Turbo decoder according to claim 18, wherein a single decoder element comprises both decoding elements and is configured to use time-division multiplexing, and a single memory configured to store the extrinsic information of the first decoding element or a variable which is associated with the extrinsic information, and configured to store the extrinsic information of the second decoding element or a variable which is associated with the extrinsic information.

* * * * *

UNITED STATES PATENT AND TRADEMARK OFFICE
CERTIFICATE OF CORRECTION

PATENT NO. : 7,657,819 B2  Page 1 of 1
APPLICATION NO. : 11/366982
DATED : February 2, 2010
INVENTOR(S) : Berkmann et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 652 days.

Signed and Sealed this

Thirtieth Day of November, 2010

David J. Kappos
*Director of the United States Patent and Trademark Office*